United States Patent [19]

Knapp et al.

[11] 4,393,464

[45] Jul. 12, 1983

[54] CHIP TOPOGRAPHY FOR INTEGRATED CIRCUIT COMMUNICATION CONTROLLER

[75] Inventors: George W. Knapp, Cambridge; Bernard B. Spaulding, The Plains, both of Ohio

[73] Assignee: NCR Corporation, Dayton, Ohio

[21] Appl. No.: 215,975

[22] Filed: Dec. 12, 1980

[51] Int. Cl.[3] .................... G06F 13/00; H01L 25/00
[52] U.S. Cl. .................................. 364/900; 364/200; 357/45
[58] Field of Search ... 364/200 MS File, 900 MS File; 357/40, 45

[56] References Cited

U.S. PATENT DOCUMENTS

| | | | |
|---|---|---|---|
| 3,968,478 | 7/1976 | Mensch, Jr. ...................... | 364/200 |
| 4,021,781 | 5/1977 | Caudel ............................. | 357/45 X |
| 4,125,854 | 11/1978 | McKenny ........................ | 357/45 X |
| 4,144,561 | 3/1979 | Tu et al. ........................... | 364/200 |
| 4,278,897 | 7/1981 | Ohno et al. ...................... | 357/45 X |

Primary Examiner—Harvey E. Springborn
Attorney, Agent, or Firm—J. T. Cavender; Wilbert Hawk, Jr.; Richard W. Lavin

[57] ABSTRACT

An integrated circuit for operatively connecting a plurality of peripheral devices to a processor includes first, second, third and fourth sequentially located edges forming a rectangle. The integrated circuit includes two independent full duplex, master peripheral ports in which each port provides two character buffering on both input and output channels. Data may be transmitted using two message formats at two different clock frequencies with each channel having simultaneous sending and receiving capabilities. Data processing circuits are located adjacent the first edge which connects to the processor while the port control circuitry is located adjacent the third edge of the chip which connects to the peripheral devices.

14 Claims, 19 Drawing Figures

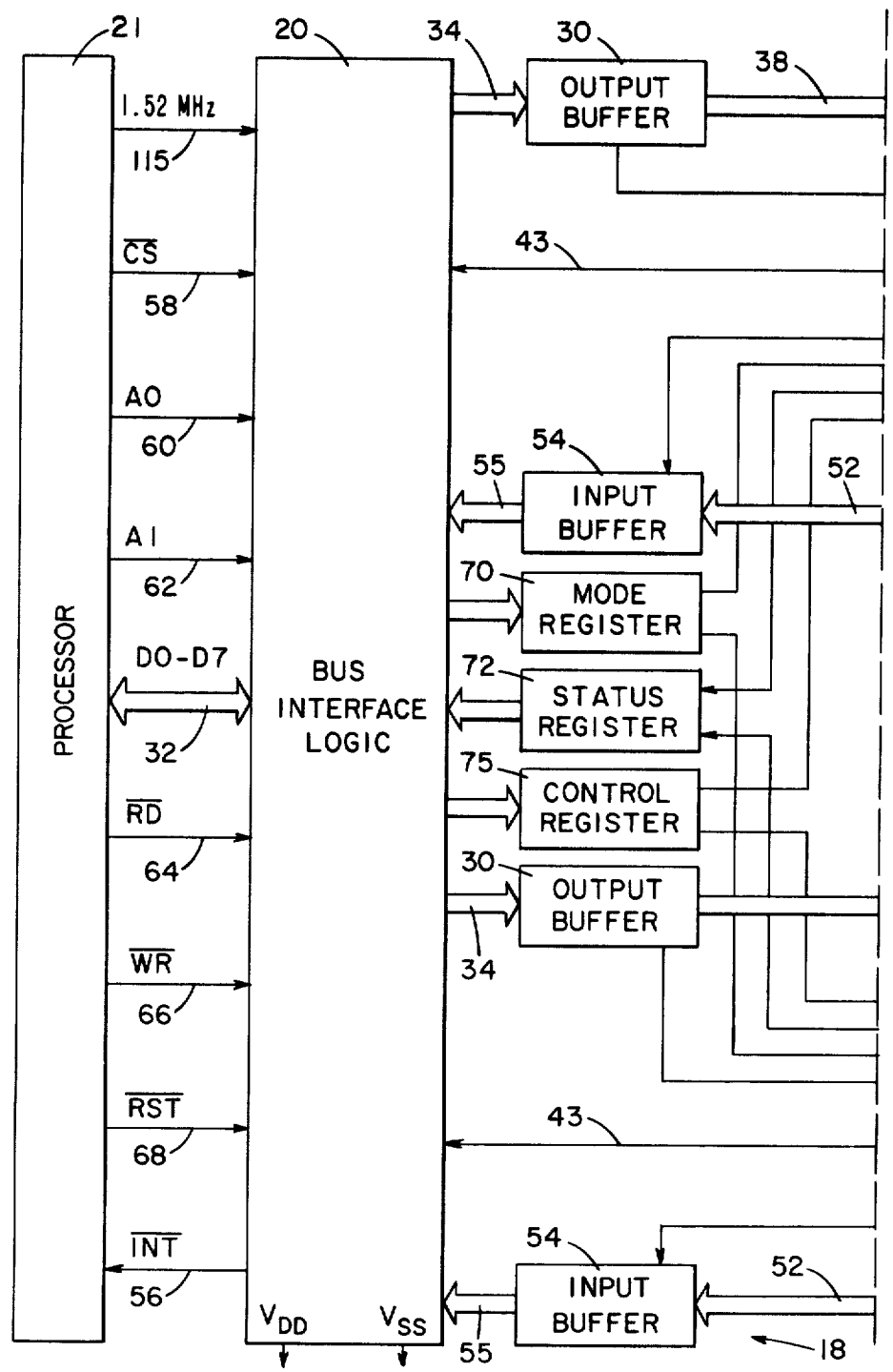

| FIG. 3A | FIG. 3B |
| FIG. 3C | FIG. 3D |
| FIG. 3E | FIG. 3F |

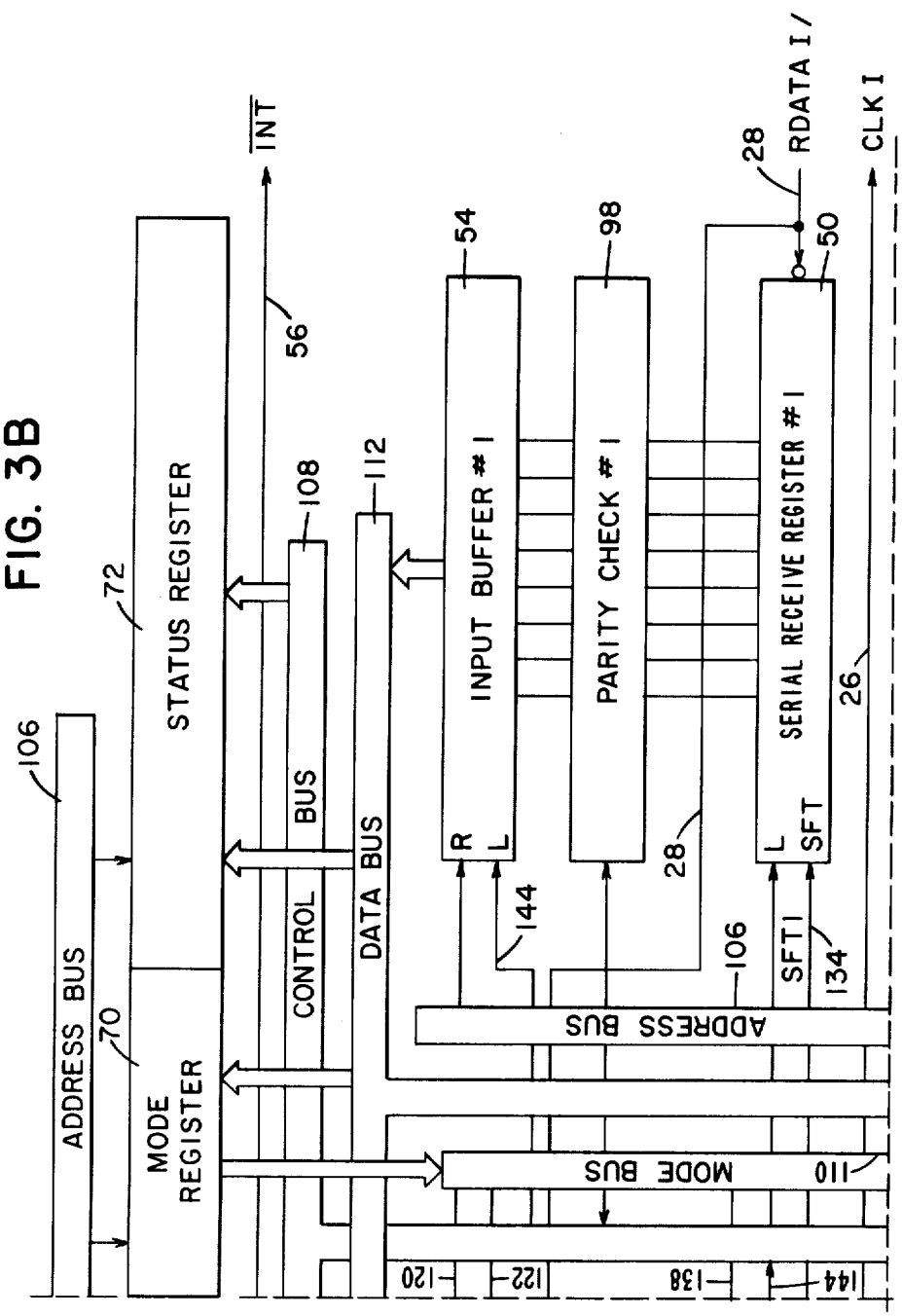

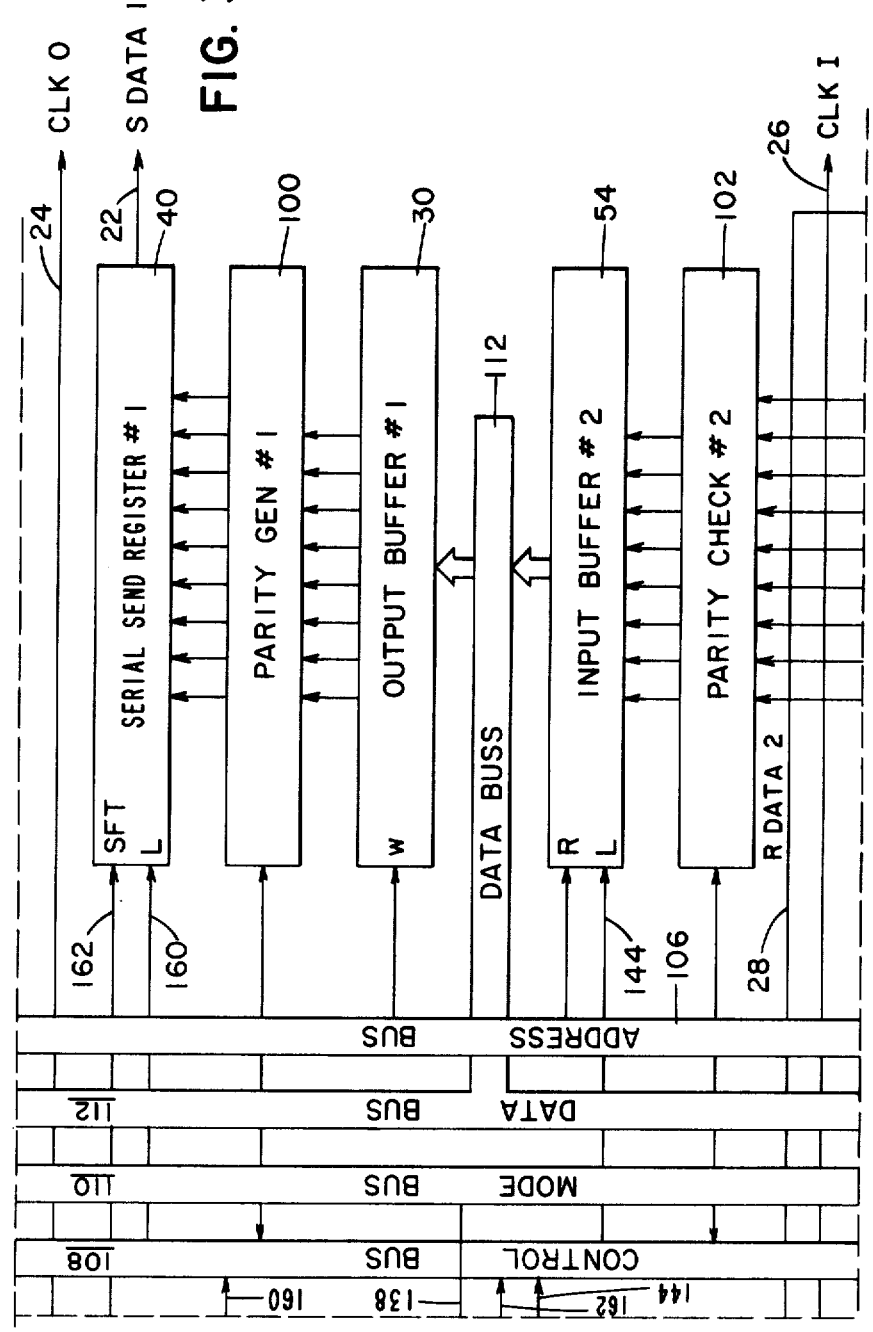

CHIP TOPOGRAPHY FOR INTEGRATED CIRCUIT COMMUNICATION CONTROLLER

BACKGROUND OF THE INVENTION

The present invention relates to integrated circuits for economically communicating between a plurality of peripheral devices and a processor.

Use of MOS (metal-oxide-seminconductor) large-scale integrated (LSI) circuits in electrical devices has contributed to the cost reduction of such devices. In designing such semiconductor chips, the large number of MOSTs (metal oxide-semiconductor-transistors) together with the interconnection patterns of conductor lines therebetween must be optimized to provide the highest component density in order to reduce the required chip area to a minimum. Minimum line widths and spacing between the respective conductors composed of either polycrystalline silicon or aluminum and the MOSTs must be maintained to avoid short circuits and parasitic effects. Yet, the length of the interconnecting lines and their associated capacitances must be minimized not only to reduce chip size, but also to achieve maximum circuit operating speeds. A wide variety of trade-offs, including the necessity to minimize chip size, to increase circuit operating speed, to reduce power consumption, and to achieve acceptable reliability are involved in obtaining an optimum "layout" or arrangement of MOSTs and interconnection patterns therebetween in order to obtain a MOS LSI circuit which is both economical and has acceptable operation characteristics. Often, the technical and commercial success of an electronic product utilizing MOS LSI technology hinges on the ability of the chip designer to achieve an optimum chip topography.

Some of the numerous design constraints faced by the MOS LSI chip designer include specifications for the minimum width and spacing of diffused regions in the silicon, the minimum size required for contact openings in the insulating field oxide, the spacings required between the edges of contact openings to the edge of diffused regions, the minimum widths and spacing of polycrystalline silicon conductors, the fact that such polycrystalline silicon conductors cannot coincide with diffused regions, the minimum widths and spacings between the aluminum conductors, and the constraint that conductors on the same layer of insulating oxide cannot cross over like conductors. The high amount of capacitance associated with diffused regions and the resistances of both diffused regions and the polycrystalline silicon conductors must be carefully considered by the circuit designer and the chip designer in arriving at an optimum chip topography. Accordingly, it is an object of the present invention to provide an integrated circuit communication controller chip for effecting the transfer of data signals between a plurlity of remote peripheral devices and a processor in which the integrated circuit chip has a topography which provides the maximum possible circuit operating speed with the lowest possible chip size and power dissipation. It is a further object of this invention to provide an integrated chip for generating more than one data format for transmission between a processor and a plurality of remote peripheral devices at more than one clock rate. It is still a further object of the present invention to provide an integrated circuit communication controller chip which is very low in cost.

SUMMARY OF THE INVENTION

Briefly described, the invention provides an MOS LSI communication controller integrated chip having optimized chip topography. The chip topography includes two full duplex communication channels and internal data, address, mode, timing and control buses. The integrated circuit chip includes first, second, third and fourth sequentially located edges for forming a rectangle. Input/output circuitry for each communication channel is located along the right edge of the chip and is coupled to the address, data and control buses. Clock control circuits located along the left edge of the chip provide either one of two data clocking frequencies. A clock generator circuit is located in the upper left hand corner of the chip which, together with the input/output circuitry, receives control signals from the processor for generating a plurality of clock signals for use in operating the circuitry. The integrated circuit chip includes storage circuits located along the right edge of the chip in which input and output data is stored under the control of the input/output circuitry. The input/output circuitry and the storage circuits are spaced apart, allowing the buses to be located adjacent circuits to which the buses are connected. Counter circuits coupled to the clock generator circuit provide selected first and second clock rates used in transmitting data between the processor and the peripheral devices.

BRIEF DESCRIPTION OF THE DRAWINGS

FIGS. 1A and 1B, taken together, constitute a block diagram of a communication controller system in which the integrated circuit of the present invention is included;

FIGS. 3A-3F inclusive, taken together, provide a more detailed block diagram of FIG. 2 illustrating the general location of the various sections of circuitry on the surface of the integrated circuit chip of the present invention;

DESCRIPTION OF THE PREFERRED EMBODIMENT

Figure 1B:
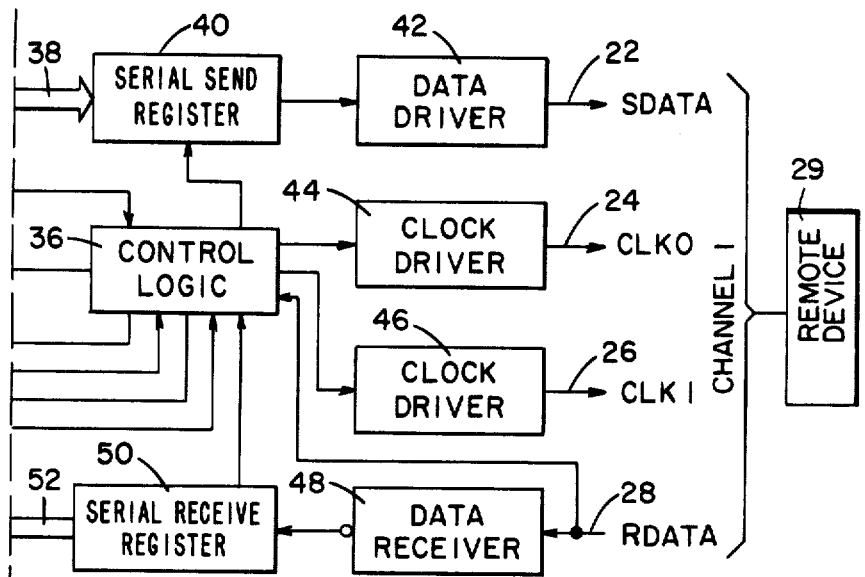

Referring now to FIGS. 1A and 1B, there is shown a block diagram of the communication controller circuit generally indicated by the numeral 18 which includes an interface logic unit 20 which interfaces a host processor 21 with a plurality of remote peripheral devices 29 over a pair of communication channels each consisting of four wires 22-28 inclusive. Since each channel is of the same construction, the following description will cover only one channel with like elements in both channels having the same numerical designation.

As shown in FIG. 1A, each channel includes an Output Buffer 30 in which a data character transmitted in parallel over the data bus 32 from the host processor 21 is stored. Under control of signals generated in a Control Logic unit 36, the data character stored in the Output Buffer 30 is transferred in parallel over bus 38 to the Serial Send Register 40 along with the required parity bits. The data character and its associated parity bits is shifted synchronously with the clock signals CLK0 on line 24 out of the Serial Send Register 40 and transmitted by a Data Driver 42 over the send data (SDATA) line 22 to the selected remote peripheral device at one of two clock rates selected by the Control Logic unit 36. At the completion of the transmission of the data character and its associated parity bits in a manner that will be described more fully hereinafter, the Control Logic unit 36 will signal the Bus Interface Logic unit 20 over line 43 enabling the unit 20 to lower the signal INT over line 56 raising an interrupt to the processor 21. The selected clock out signals CLK0 are outputted by a Clock Driver 44 over line 24 to a remote peripheral device.

When a remote peripheral device requests access to the host processor 21, the peripheral device will lower the signal on the receive data (RDATA) line 28 signalling the Control Logic unit 36 of the request. The Control Logic unit 36 will enable a Clock Driver 46 to output one of a plurality of two clock in signals (CLKI) over line 26 enabling the peripheral device to transfer the data character over line 28 through a Data Receiver 48 and into the Serial Receive Register 50. Under the control of signals generated by the Control Logic unit 36, the data character in the Serial Receive Register 50 is loaded in parallel over bus 52 into an Input Buffer 54. At this time, the Control Logic unit 36 will signal the Bus Interface Logic unit 20 of the storing of the data character in the Buffer 54, enabling the Bus Interface Logic unit 20 to lower the signal INT on line 56 raising an interrupt to the processor 21.

The communication format of the data message is provided by the processor over the data bus 32 and lines 58-68 inclusive. The Bus Interface Logic unit 20 will load the Mode Register 70 with a data word signifying that the data format generated will be either an 8-bit word or a 9-bit word, together with one of two clock rates. In an 8-bit word data format, five bits represent the data to be transferred, one bit is an end-of-message flag, while two bits are used for parity checking. In the 9-bit format, eight bits represent the data while one bit represents the "end-of-message" flag. Each of the data formats can be executed at a clock rate of either 48 KHz. or 144 KHz. In addition to the Mode Register 70, the controller 18 includes a Status Register 72 which includes data indicating a character is required to be written to the Output Buffer 30; a character is available to be read from the Input Buffer 54; a parity error was detected during the reception of the 8-bit data character format and a last byte flag was detected during reception. Also included in the controller circuit 18 is a Control Register 75 which provides task definition. Data stored in the Register 75 provides masking of the signal INT, transmitting of the last character and diagnostic selection.

Figure 2:
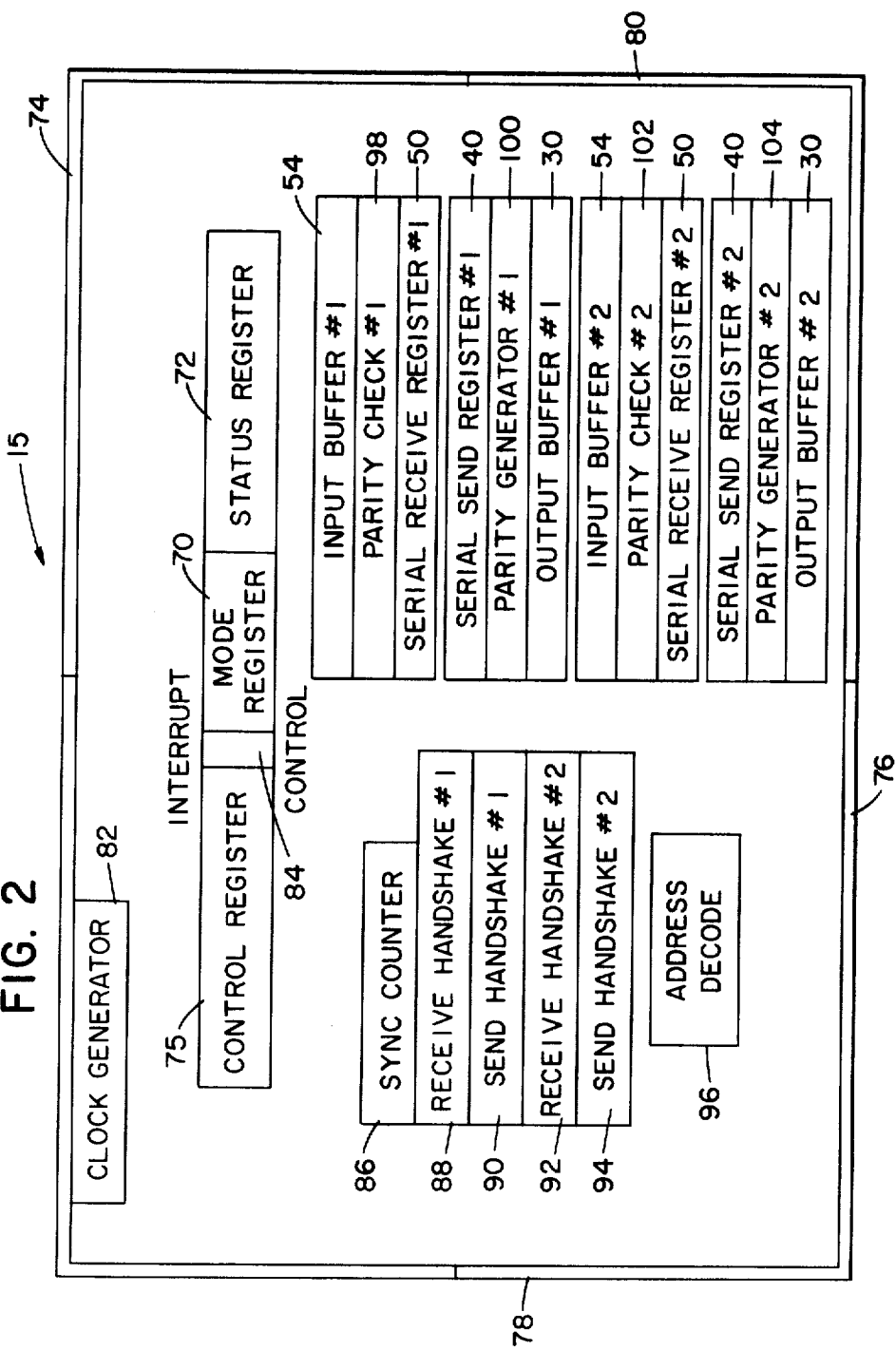
FIG. 2 is a block diagram illustrating the general location of the major sections of circuitry on the surface of the integrated circuit chip of the present invention.

Referring now to FIG. 2, there is shown a block diagram illustrating the general location of the major sections of circuitry on the surface of the integrated circuit chip of the present invention herein generally designed by the numeral 15. The chip includes top 74, bottom 76, left 78 and right side edges 80. The edge assignments are used in explaining the topography of the chip with the realization that a chip may have an orientation other than that shown in the drawing. Located adjacent the left portion of the top edge 74 is a bi-phase Clock Generator 82 for generating the various clock signals used by the controller. Located in the upper central portion of the chip in a horizontal alignment are the Control Register 75, an Interrupt Control circuit 84 which is located in the Control Logic unit 36 (FIG. 1), the Mode Register 70 and the Status Register 72. Stacked along the left edge 78 of the chip is a Sync Counter 86 for selecting the clock rates at which the data is to be transmitted, a Receive Handshake circuit 88 for enabling data to be shifted into the Serial Receive Register 50 from the peripheral device, and a Send Handshake circuit 90 for enabling data received from the host processor 21 (FIG. 1) to be transmitted through the Serial Send Register 40 to the peripheral devices. The circuits 86, 88 and 90 are included in the Control Logic unit 36 associated with channel 1 of the controller 18.

Further included in the stack is a Receive Handshake circuit 92 and a Send Handshake circuit 94 constructed for operation in the same manner as circuits 88 and 90. Circuits 92 and 94 are located in the Control Logic unit 36 (FIG. 1) associated with channel 2. Located adjacent the bottom edge 76 of the chip is an Address Decode circuit 96 located in the Bus Interface Logic unit 20 (FIG. 1) which decodes the address bits transmitted over the A0 line 60, A1 line 62 from the processor 21 and the read/write strobes RD appearing on line 64 and WR on line 66 for use in addressing the peripheral devices for which the data is intended.

Stacked vertically along the right edge 80 of the chip is the Input Buffer unit 54, a Parity Check circuit 98 for checking the parity bit of the data received from the peripheral device, the Serial Receive Register 50, a Parity Generator circuit 100 for generating a parity bit for the data outputted to the peripheral device and the Output buffer 30. The latter-cited circuit elements are associated with channel 1 of the controller circuit 18 with the Parity Check circuit 98 and the Parity Generator circuit 100 located in the Control Logic unit 36 (FIG. 1).

Further located in the stack along the right edge 80 of the chip are similar circuit elements associated with channel 2 of the controller circuit 18. These elements include the Input Buffer unit 54, Parity Check circuit 102, Serial Receive Register 50, Serial Send Register 40, Parity Generator circuit 104 and the Output Buffer unit 30 with circuits 102 and 104 located in the Control Logic unit 36 (FIG. 1) associated with channel 2 of the controller circuit.

Figure 4:
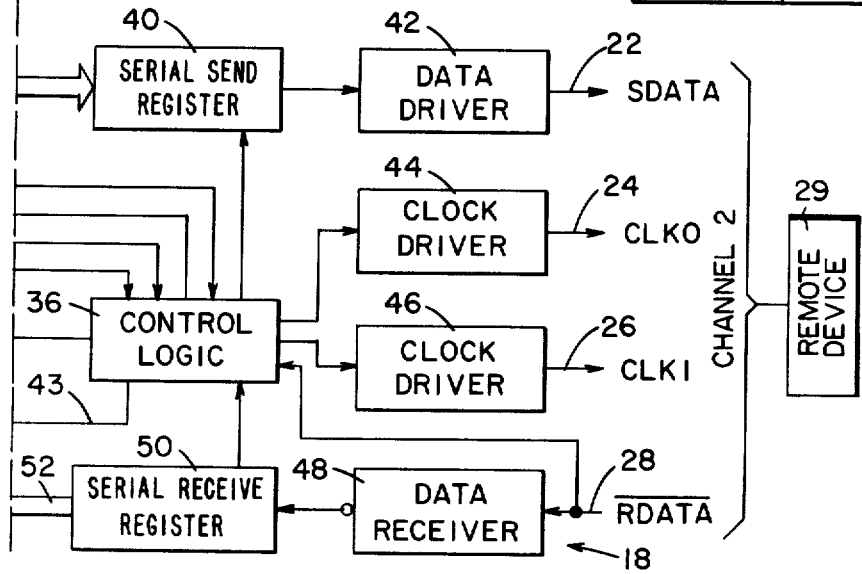
FIG. 4 is a diagram showing how FIGS. 3A-3F inclusive are arranged.
Figure 3A:
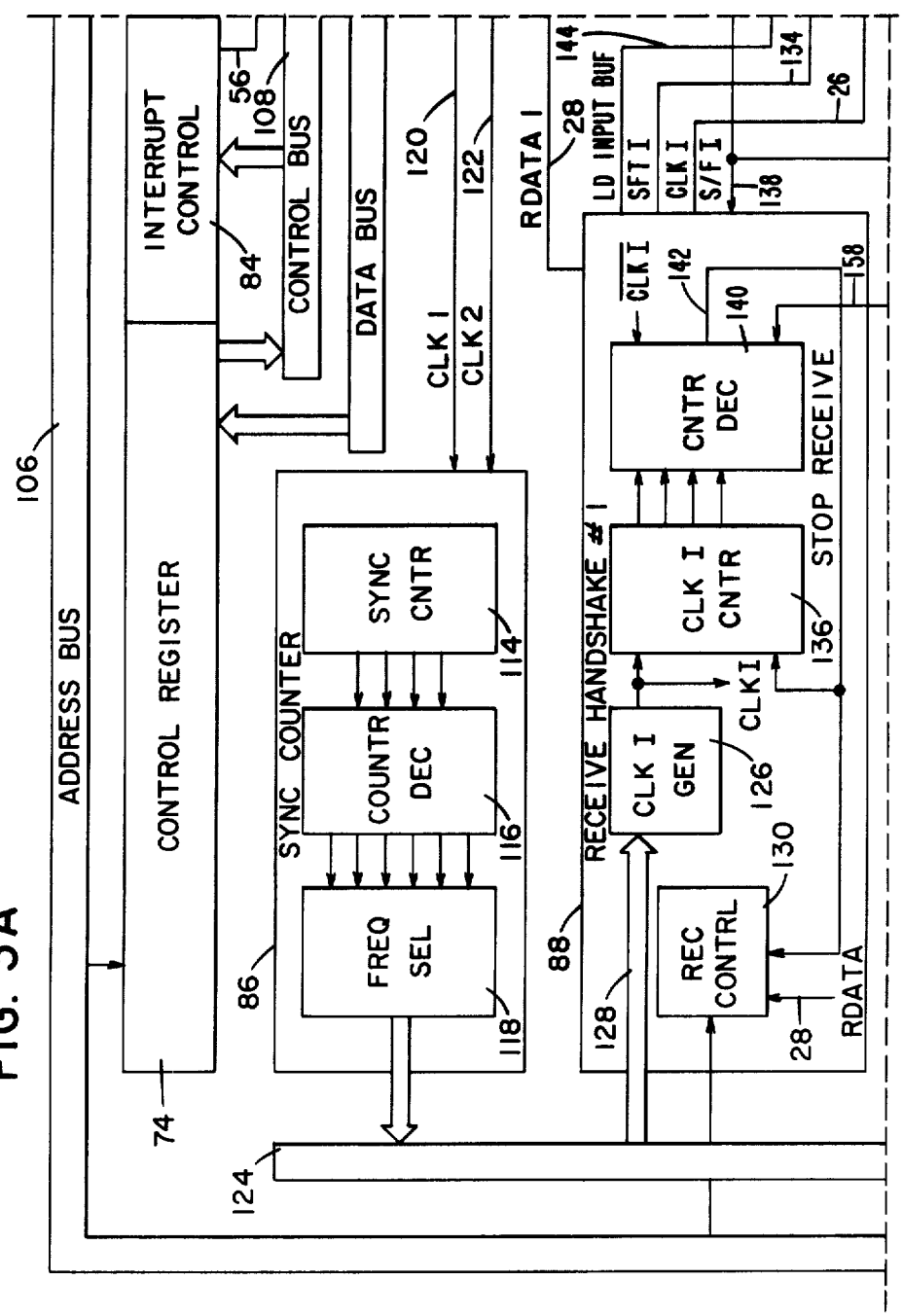
Figure 3C:
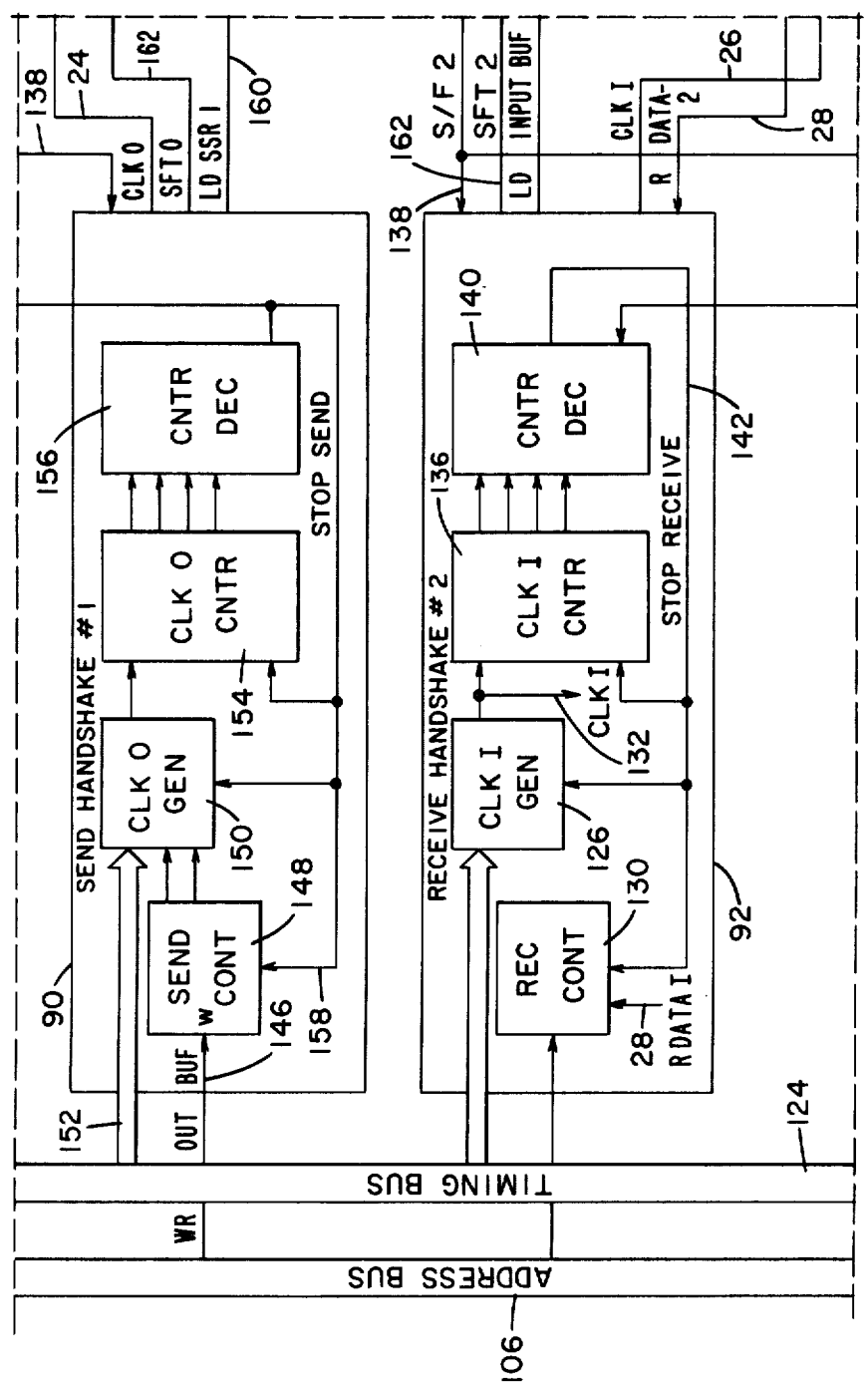
Figure 3E:
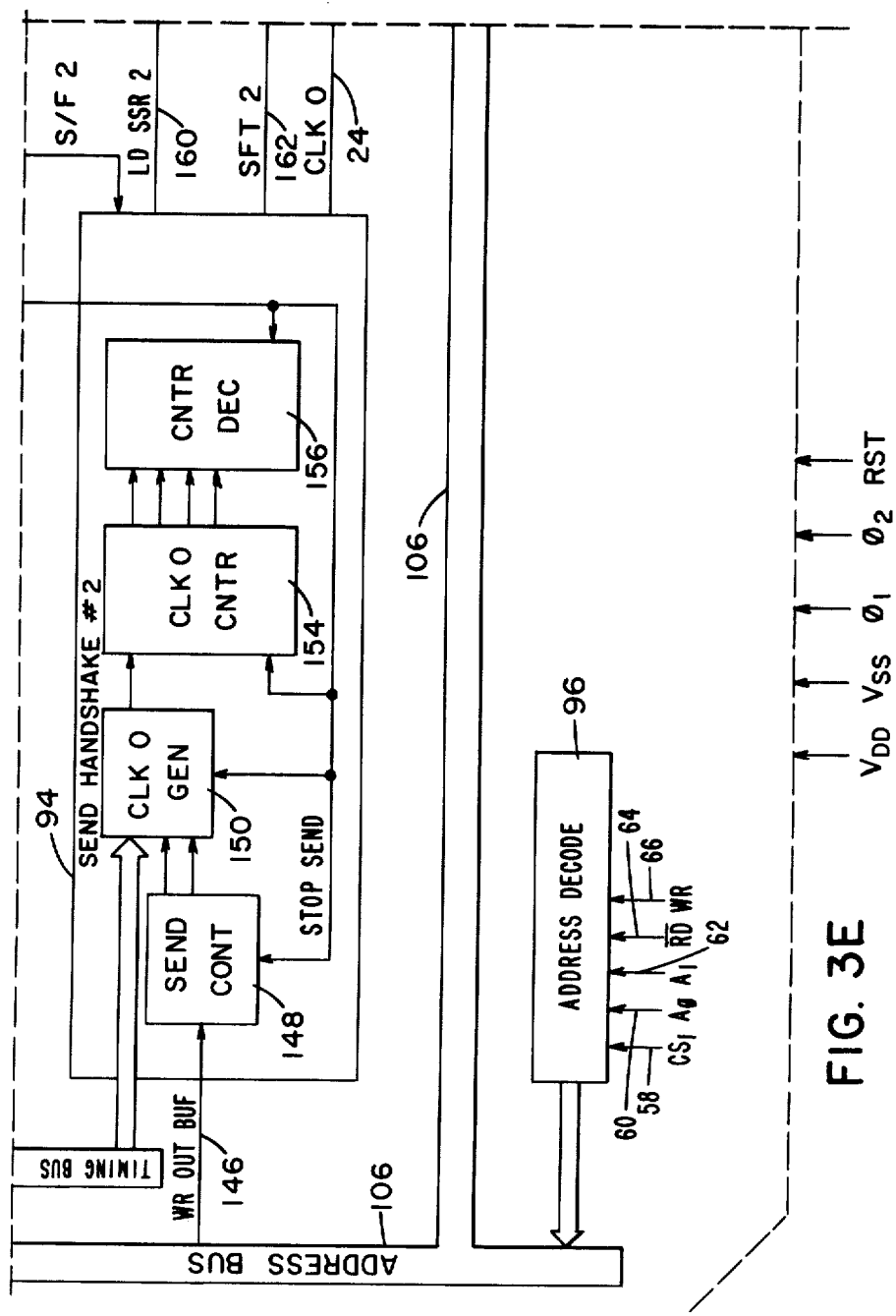
Figure 3F:
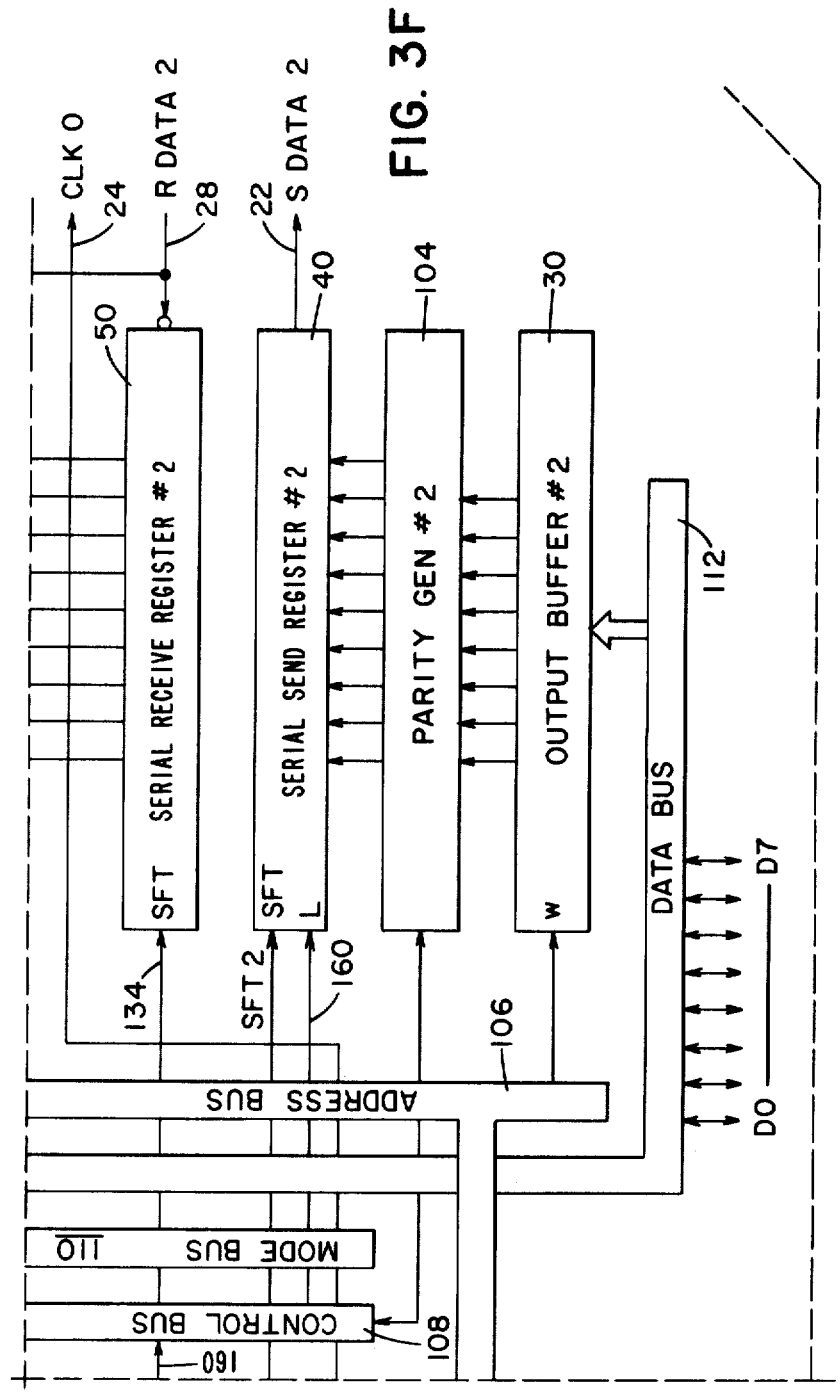
Figure 5:
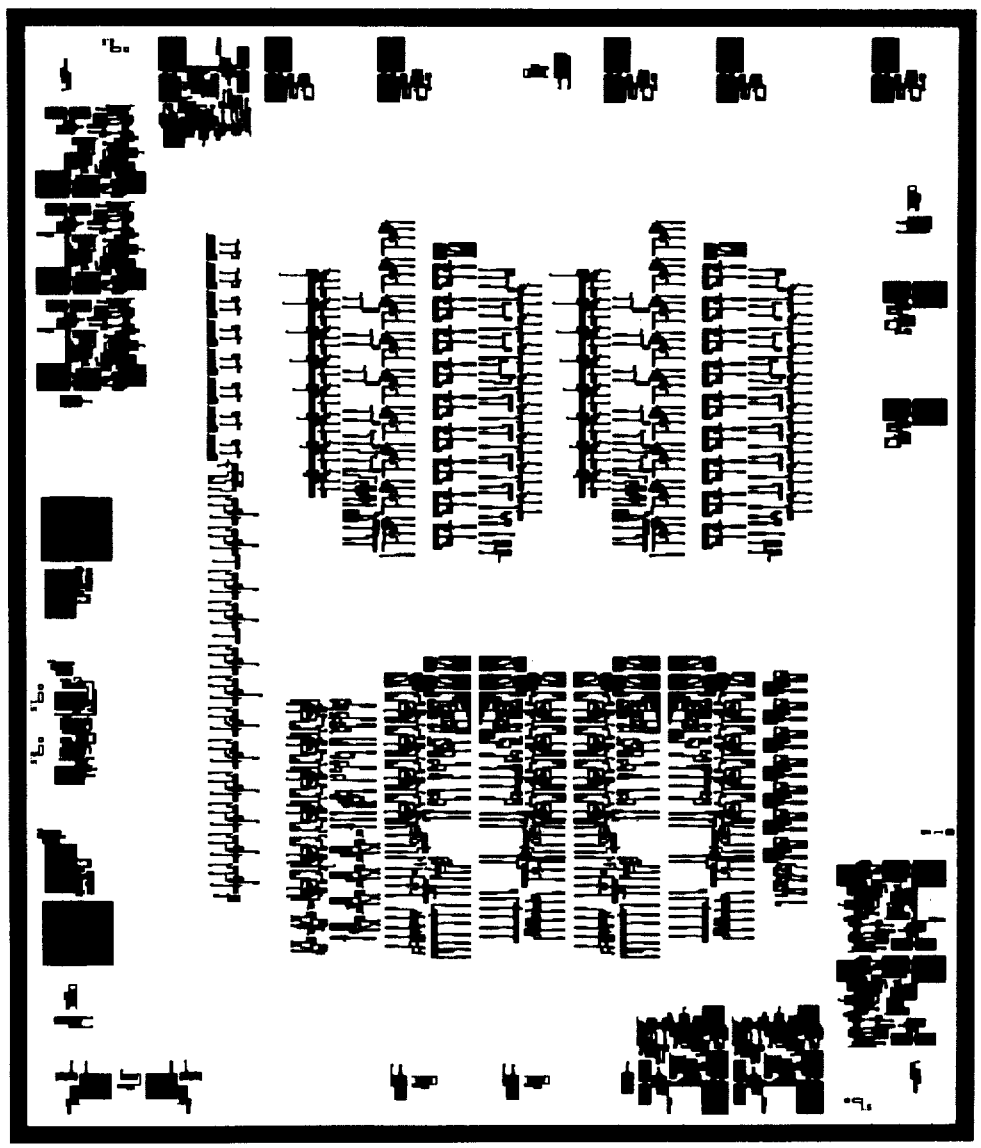
FIG. 5 is a scale reproduction of a photo mask utilized to define the pattern of the source-drain diffused regions in the integrated circuit chip of the present invention.
Figure 6:
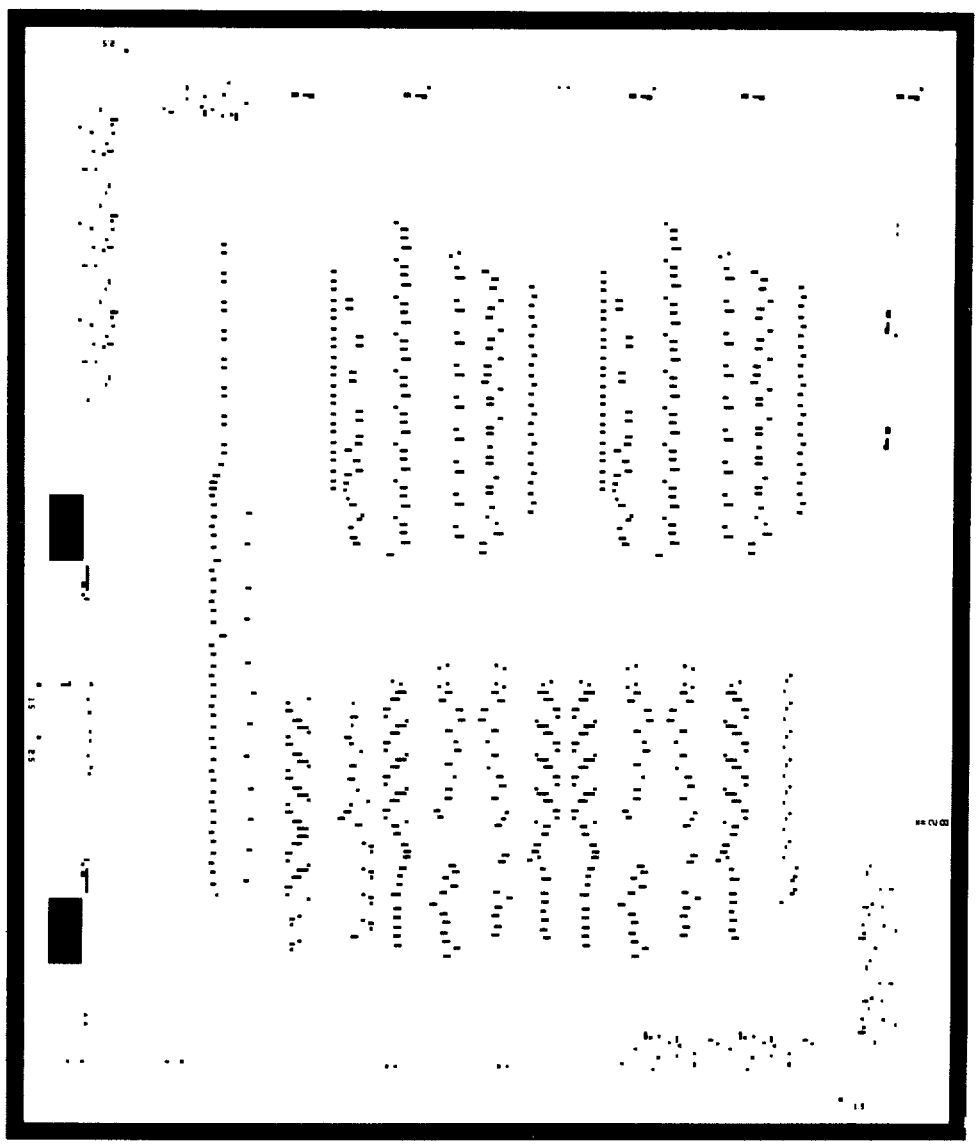
FIG. 6 is a scale reproduction of a photo mask utilized to define the pattern of the ion implanted depletion regions of the integrated circuit chip of the present invention.
Figure 7:
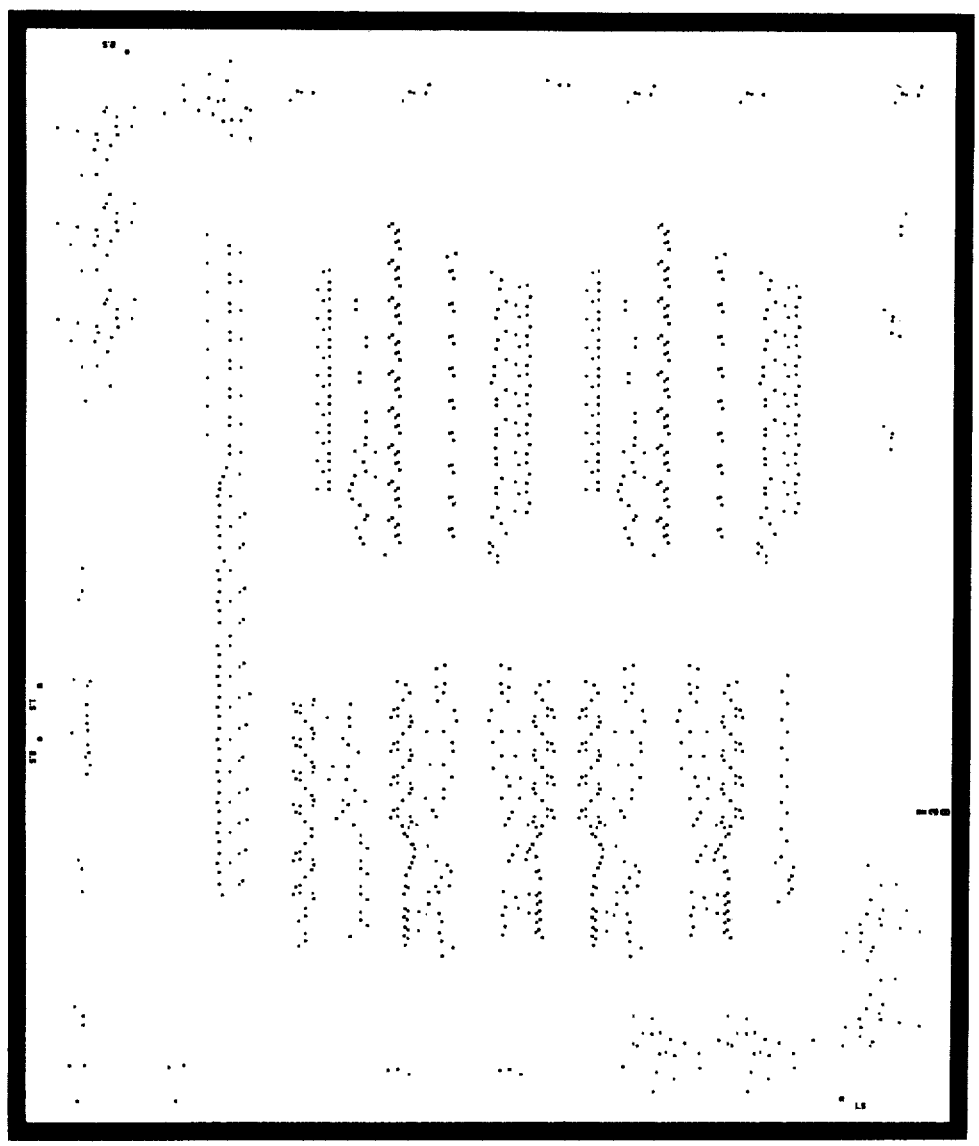
FIG. 7 is a scale reproduction of a photo mask utilized to define the pattern of contacts between the polycrystalline silicon conductors and the diffused regions of the integrated circuit chip of the present invention.
Figure 8:
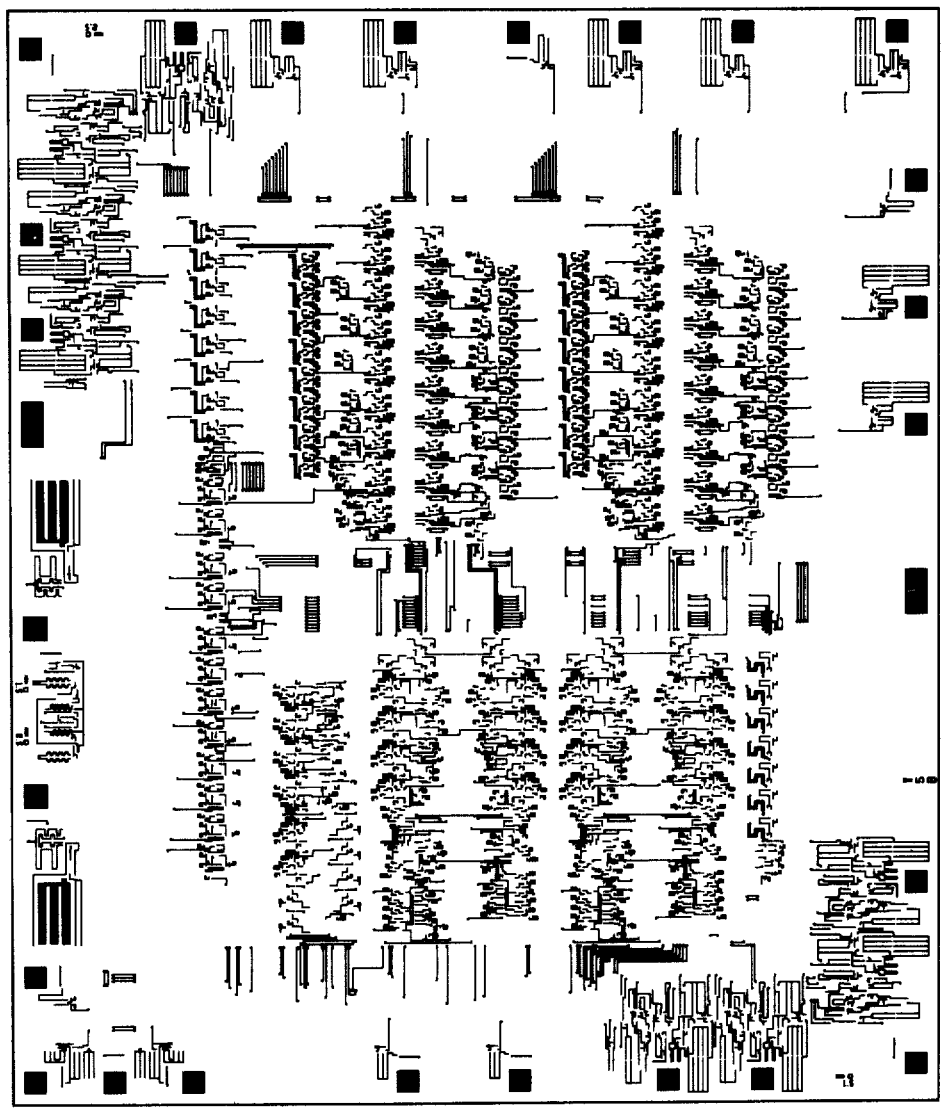
FIG. 8 is a scale reproduction of a photo mask utilized to define the pattern of the polycrystalline silicon layer of the integrated circuit chip of the present invention.
Figure 9:
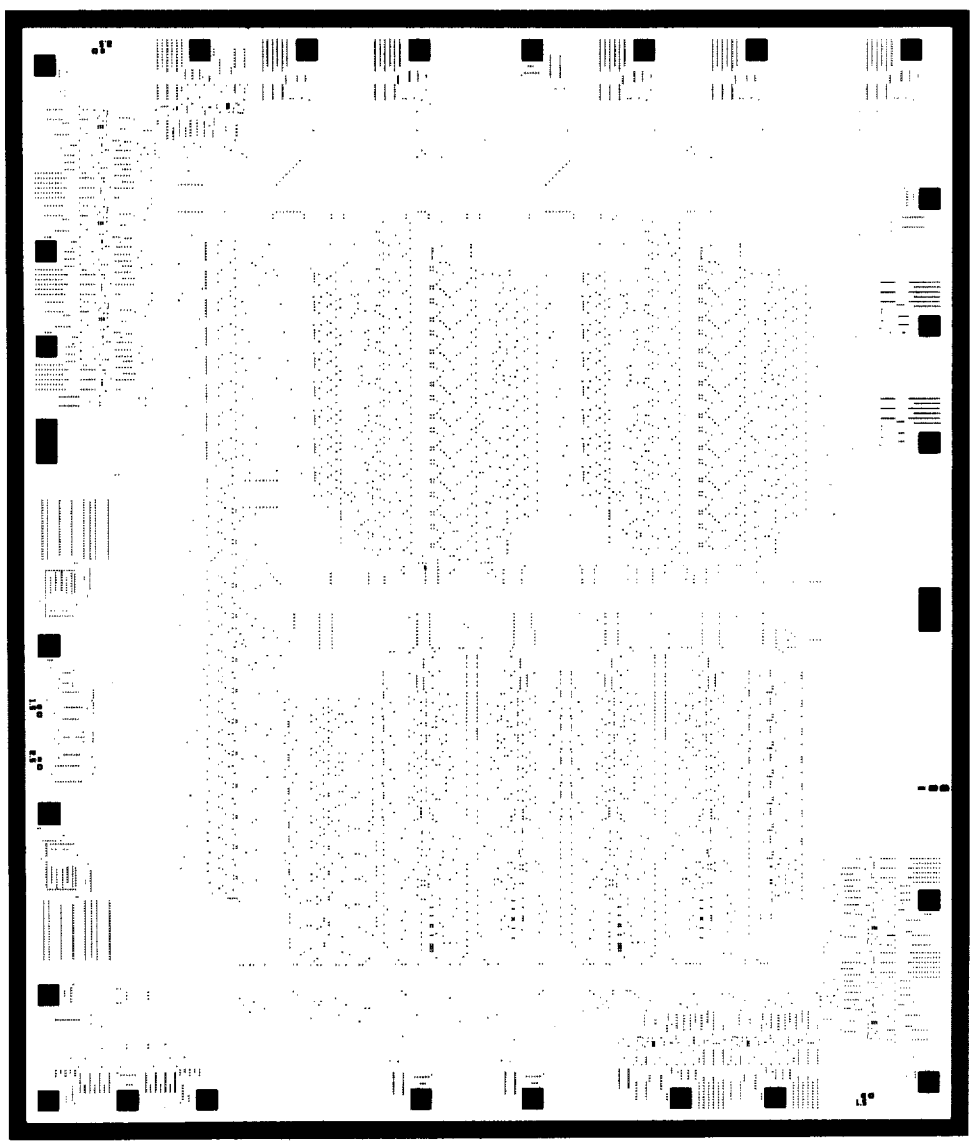
FIG. 9 is a scale reproduction of a photo mask utilized to define all conductor interconnection contacts in the integrated circuit chip of the present invention.

Referring now to FIGS. 3A–3F inclusive and as arranged in the manner disclosed in FIG. 4, there is shown a more detailed block diagram of the circuits location disclosed in FIG. 2. Included in the circuitry is an address bus 106 (FIGS. 3A–3F inclusive) extending along the top edge 74 of the chip between the Clock Generator circuit 82 (FIG. 2) and the Register circuits 70–75 inclusive. The address bus 106 also extends along the left 78 and bottom sides 76 of the chip and further extends vertically through the middle of the chip (FIGS. 3B, 3D and 3F). The address bus 106 distributes the decoded address signals from the Address Decode circuit 96 (FIG. 3E) which receives over lines 58–66 inclusive (FIG. 1) the address signals from the processor 21. The circuit decodes the signal and transmits the decoded signals over the bus 106 to the Control Register 75 for writing a control byte of data signalling the last byte of a message being sent to the peripheral device; the Mode Register 70 for selecting the clock rate used to transmit/receive the data and word format; the Receive and Send Handshake circuits 88, 90, 92 and 94 (FIG. 2) inclusive and to the Input and Output Buffers 54 and 30 respectively enabling a data message to be transferred between the host processor 21 and a remote peripheral device in a manner that will be described more fully hereinafter.

Further included in the circuitry is a control bus 108 extending through the middle of the chip and over which control signals stored in the Control Register 75 (FIG. 3A) are distributed to other circuits on this chip for controlling the operation of the controller circuit 18. Located between the control bus 108 and a portion of the address bus 106 is a mode bus 110, and the data bus 32 (FIGS. 3B, 3D and 3F). The mode bus is coupled to the Mode Register 70 (FIG. 3B) which stores data bits selecting the clock rate and word format by which data is transmitted between the communications controller circuit 18 and the remote peripheral devices. In the case of a data character transmission, the data character is transferred over the data bus 32 (FIGS. 1, and 3F) from the processor 21 to the Output Buffer 30 (FIG. 3F). The data character is transferred through the Parity Generator 104, which appends the appropriate parity information to the Serial Send Register 40 for serial transmission to the peripheral device. In the case of a data character originating in the peripheral device, the data character described previously is received in the Serial Receive Register 50 (FIG. 3B) from which it passes through the Parity Check circuit 102 (FIG. 3B) and transferred to the Input Buffer 54 from where it is transferred on the data bus 32 (FIG. 3F) to the processor 21.

Referring now to FIG. 3A, there is shown a diagram of the Sync Counter 86 which includes a 4-bit Sync Counter 114 receiving 1.152 KHz. clock signals over line 115 (FIG. 1) from the processor 21. The Counter 114 is controlled by either of the signals CLK1, CLK2 received over line 120 and 122 respectively from the Mode Register 70 (FIG. 3B) and distributed through the mode bus 110 for selecting the clock rate of 48 KHz. or 144 KHz. respectively. The output bits of the Counter 114 are decoded in Counter Decoder 116 and transmitted to the Frequency Selector 118 which selects the required clock frequency in accordance with the mode signals CLK1 and CLK2 for distribution through a timing bus 124 which extends along the left edge of the chip adjacent the address bus 106.

Located below the Sync Counter 86 on the chip is the Receive Handshake circuit 88 associated with channel 1 of the controller circuit 18 for controlling the storing of the data received from the peripheral device in the Serial Receive Register 50. Since the construction and operation of the Receive Handshake circuit 88 for channel 1 is the same for the Receive Handshake circuit 88 (FIG. 3C) for channel 2, the description of the circuit will be limited to the circuits shown in FIG. 3A, and like numerals will be used in both circuits to designate like elements.

Included in the Receive Handshake circuit 88 (FIG. 3A) is the CLOCK I Generator 126 which receives over timing bus 124 the 48 KHz. or the 144 KHz. clock signals generated by the Sync Counter 86 in the manner described previously. When the RDATA 1 line 28 (FIG. 1) goes low indicating that the peripheral device is ready to send data to the processor, a Receive Control unit 130 comprising a pair of flip-flops enable the CLOCK I Generator 126 to output the clock signals received over bus 128. The output clock signal (CLOCK I) corresponding to either 48 or 144 KHz. is outputted over line 26 (FIGS. 1, 3A and 3B) to the peripheral device, enabling the peripheral device to clock out a data character into the Serial Receive Register 50 (FIG. 3B) over line 28. The Register 50 is controlled by shift in signals SFTI generated by the CLOCK I Generator 126 over line 134. The contents of the Register 50 are transferred by a load signal transmitted over the control bus 108 from the Control Register 74 to the Input Buffer 54.

The CLOCK I output signals from the Generator 126 are also transmitted over line 26 to a Counter 136 which counts the number of CLOCK I transitions outputted by the Generator 126. As previously described, data stored in the Mode Register 70 (FIG. 3B) selects an 8-bit data format (S) for processing or a 9-bit format (F) in which the latter format does not include a parity bit. In accordance with the level of the format data signal S/FI appearing on input line 138 (FIG. 3A and 3B) from the mode bus 110, a Counter Decoder 140 (FIG. 3A) coupled to the output of the CLOCK I Counter 136 will output a stop receive sigal over line 142 of the Counter 136 if the Counter has reached a count equal to the selected format, thus indicating that the data character received from the peripheral device is stored in the Receive Register 50 (FIG. 3). The stop receive signal appearing on line 142 will stop the operation of the Handshake circuit 88.

After a predetermined time period which allows the received data character to pass through the Parity Check circuit 98 is required, the Receive Control circuit 130 will output the signal LD INPUT BUF over line 144 to the Input Buffer 54 (FIG. 3B) through the control bus 108 allowing the received data character stored in the Receive Register 50 to be transferred into the Input Buffer 54. Once the data character has been loaded into the Input Buffer 54, the Interrupt Control unit 84 (FIG. 3A) in response to the generation of the LD INPUT BUF signal will generate the interrupt signal INT over line 56 (FIGS. 1, 3A and 3B) notifying the host processor 21 of the available data character if the Control Register input enable bit is set. The Receive Control circuit 130 upon generating the signal LD INPUT BUF disables the Receive Handshake circuit 88 from loading the Input Buffer 50 with a received data character until the data character presently in the Input Buffer 54 is read by the processor 21.

When the processor 21 has a data character for transmission to a peripheral device, the address signals CS, A0, A1, RD, WR appearing on lines 58-66 inclusive (FIGS. 1 and 3E) will be decoded by the Address Decoder circuit 96 resulting in the decoded write output buffer signal WR OUT BUF appearing on the address bus 106. The data signals D0-D7 appearing on bus 32 (FIG. 1) will be transmitted to the Output Buffer 30 (FIG. 3D) over the data bus 112 in response to the WR OUT BUF signal appearing on line 133 (FIG. 3D). The write output buffer signal WR OUT BUF is also transmitted over the address bus 106 and over line 146 to a Send Control circuit 148 of the Send Handshake circuit 90 (FIG. 36) which enables a Clock Generator 150 to output the data clock signal CLK0 over line 24 (FIGS. 1, 3C and 3D) to the peripheral device receiving the data. The Send Control circuit 148 will also output the load signal LD SSR 1 over line 160 to the Serial Send Register 40 (FIG. 3D) through the control bus 108 to transfer the data character from the Output Buffer 30 to the Serial Send Register 40. The CLK0 Generator 150 receives over bus 152 the clock signals outputted from the Sync Counter 86 (FIG. 3A) corresponding to either 48 or 144 KHz. as was explained previously with respect to the operation of the Receive Handshake circuitry 88.

Operating in the same manner as the Receive Handshake circuit 88, a CLOCK 0 Counter 154 in the Send Handshake circuit will count the clock signals outputted by the Generator 150, which count is transmitted to a Counter Decoder 156 which in turn decodes the output count in accordance with the signal S/F appearing on line 138, thereby selecting the data format in the manner explained previously. The Decoder 156 will output the signal STOP SEND over line 158 upon completion of the transmission of the data character from the Send Register 40 (FIG. 3D) in accordance with the selected data format thereby disabling the signal LD SSR 1. The data character is shifted out of the Send Register 40 and over line 22 by the Data Driver 42 (FIG. 1B) synchronously with signal CLKO on line 24 to the peripheral device.

If the data format selected by the signal S/F indicates parity bits, the Parity Generator 100 (FIG. 3D) is operated by the signal to add the required parity bits to the data character transmitted from the Output Buffer 30 to the Send Register 40.

Once a data character has been transferred from the Output Buffer 30, a new character can be transferred into the Output Buffer 30 while the previous character is stored in the Send Register 40. The stop send signal appearing on line 158 (FIG. 3C) in the Send Handshake indicates the completion of the serial transfer of the data character and allows another character to be transferred to the Serial Send Register 40. This construction allows the processor 21 to do a double write operation, thereby increasing the performance of a write operation.

Figure 10:
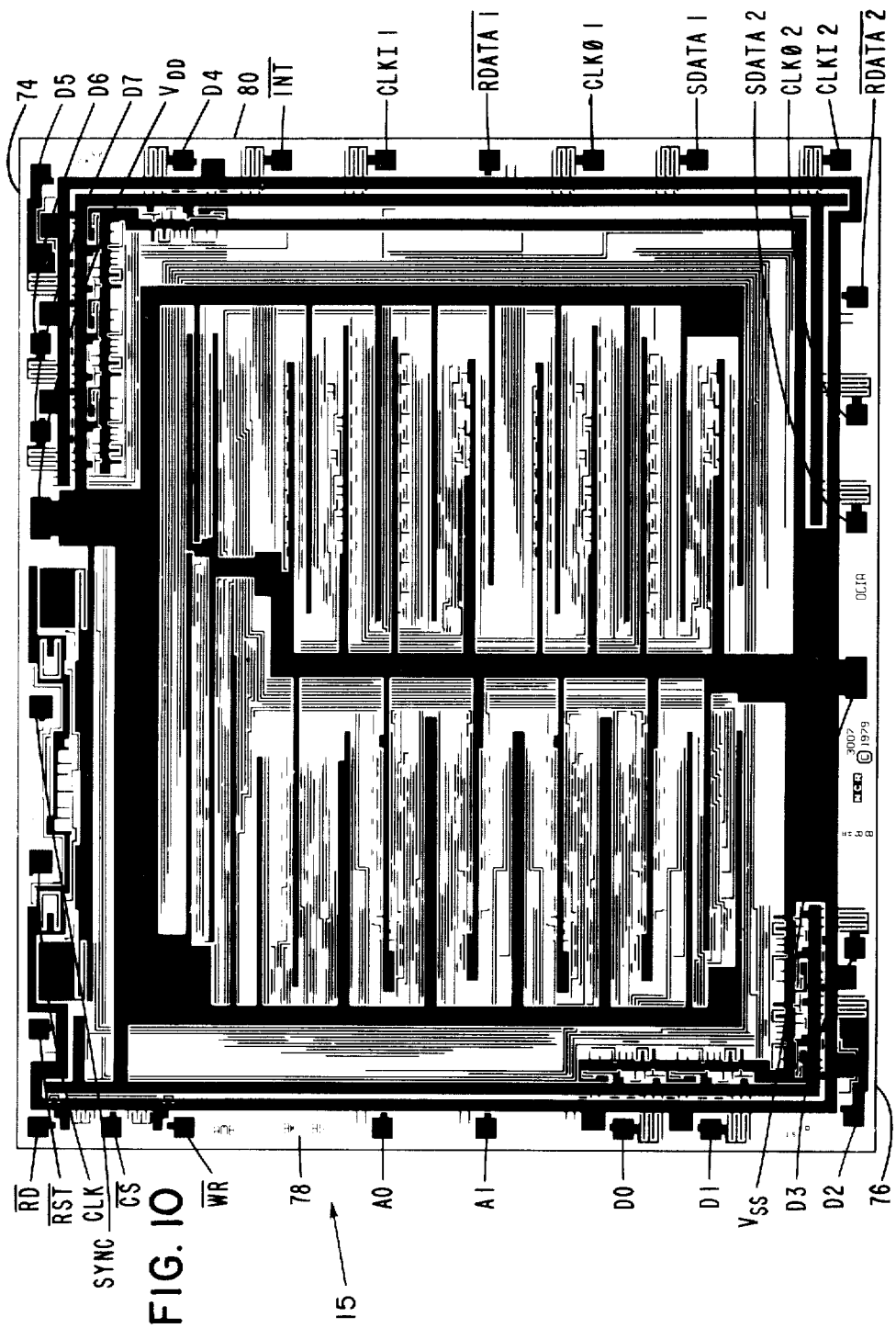
FIG. 10 is a scale reproduction of a photo mask utilized to define the pattern for the metal interconnection layer of the integrated circuit chip of the present invention showing locations of the mounting pads together with the signals associated with the circuit.
Figure 11:
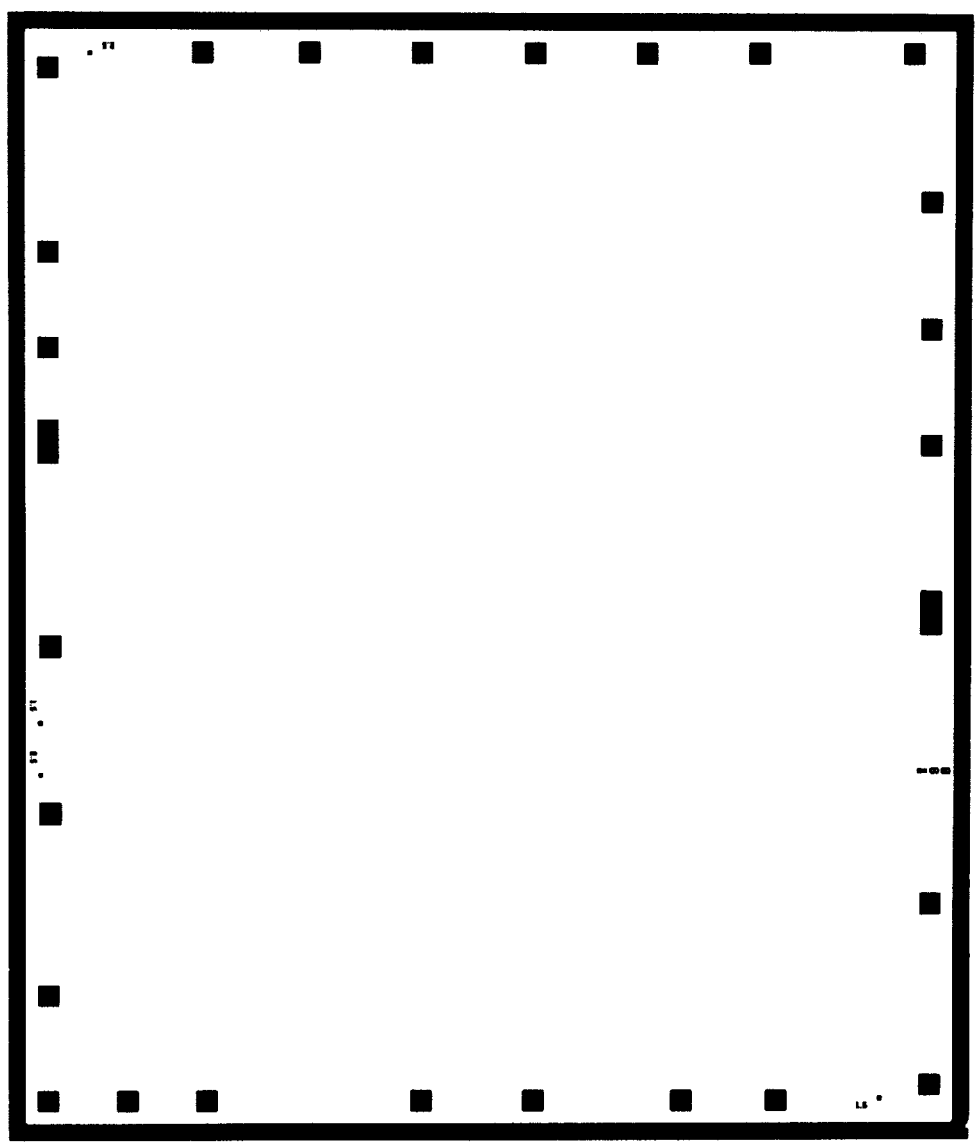
FIG. 11 is a scale reproduction of a photo mask utilized to define the pattern for the passivation layer of the integrated circuit chip of the present invention.
Figure 12:
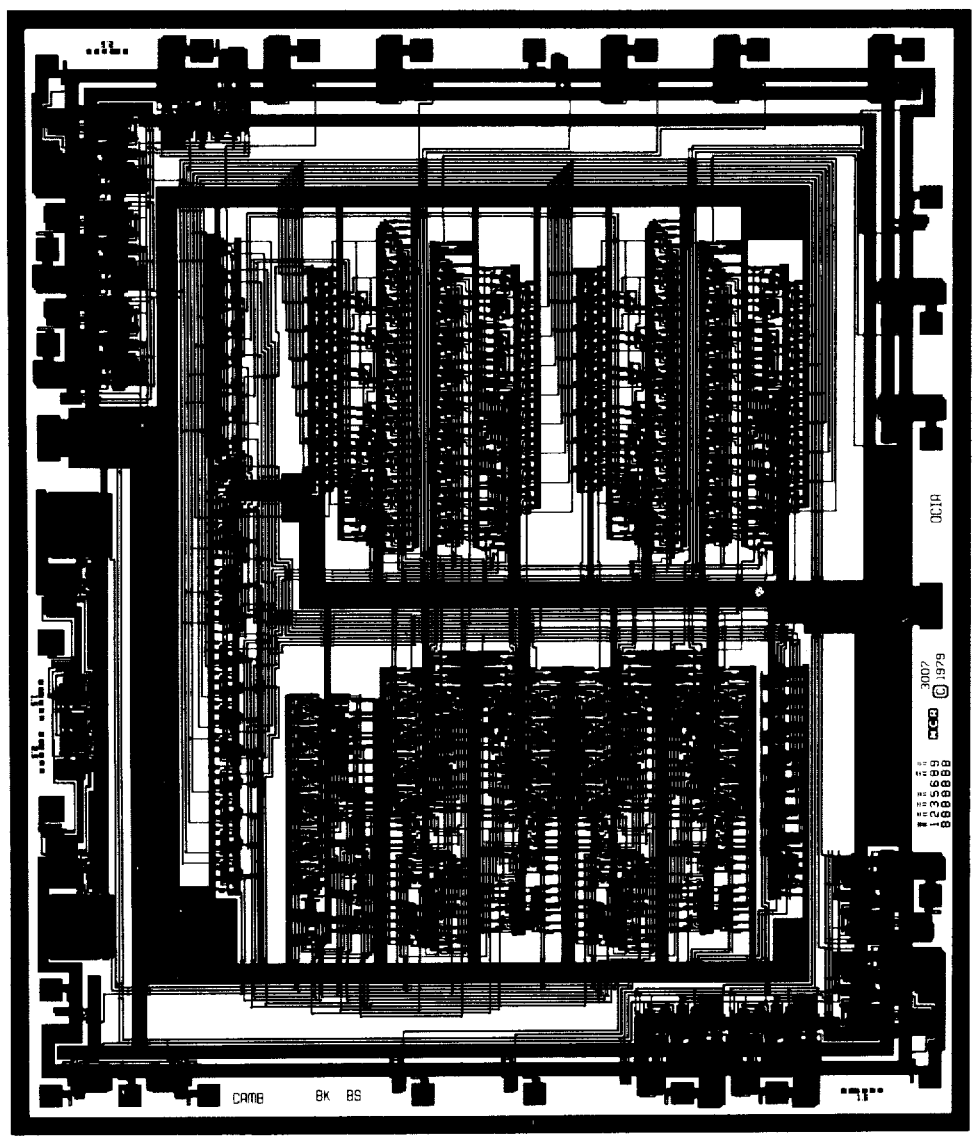
FIG. 12 is a scale reproduction of a composite of all the photo masks used in the fabrication of the integrated circuit chip of the present invention.

Referring now to FIG. 10, there is shown the location of the bonding pads for the input and output signals through the controller chip 15. The 1.152 MHz. clock signal CLK bonding pad was placed in the top edge 74 of the chip 15 adjacent the Clock Generator circuit 82 (FIG. 2). The bonding pads for the signal RST, RD, CS, WR, A1, A0 and D0-D3 inclusive generated by the processor 21 are located along the left portion of the top and bottom edges of the chip, together with the left edge of the chip to conveniently connect the host processor 21 to the controller chip 15. The bonding pads for the data signals D4-D7 and the interrupt signal INT transmitted between the processor 21 and the controller chip 15 are located adjacent the upper right hand corner adjacent the Interrupt Control 84 and Mode Register 70 (FIG. 2) which receive such signals. The bonding pad for the data and clock signals RDATA, SDATA, CLKO and CLKI associated with each communication channel are located on the right edge 80 and the right portion of the bottom edge 76 of the controller chip adjacent the Registers and Buffers associated with each channel. The double bonding pads for the voltages supplied in $V_{DD}$ located in the top edge 74 and $V_{SS}$ located in the bottom edge 76 of the chip optimizes power bus routing and substrate grounding.

The placement of the various circuits shown in FIG. 2 minimizes the length of the interconnected conductors, thereby reducing their associated capacitances and resistance. Numerous capacitance and resistance calculations and modifications of the topography of the circuitry were made to achieve optimum performance in data transmission between the processor and the peripheral devices.

It should be recognized that a very high level of creativity is required of the architect in designing MOS LSI random logic chips such as are used in microcomputers or microprocessor chips and the like because of the layout constraints for state-of-the-art manufacturing processes. For example, for silicon gate MOS manufacturing processes, the major constraints are the minimum widths and spacings of the diffused regions, the minimum widths and spacings for depletion mode gate implants, the minimum size required for pre-ohmic openings in the field oxide, the spacings required for the edge of pre-ohmic openings to the edge of diffused regions, the minimum widths and spacings of the polycrystalline silicon lines, the fact that such lines cannot cross over diffused regions and the minimum width and spacing between the metal lines, and of course the constraint that conductors in the same layer, that is, diffused regions, polycrystalline silicon lines or metallization lines cannot cross other of the same type conductors. The high amount of capacitance associated with diffused regions and the resistance of both diffused lines and polycrystalline silicon lines and to a less extent of metal lines provide further design constraints upon the chip architect. For logic circuits which may be characterized as random logic, such as those in the subject invention, a large number of lines between sections of logic circuitry are required and the very large number of possibilities for routing the various kinds of conductors to the various required sections of the chip taxes the ingenuity of even the most competent chip topology architect, and further taxes the capacity of the most sophisticated computer interconnection conductor routing programs yet available.

It should be noted that those skilled in the art can prepare a mask set for manufacturing the integrated chip on the basis of the scale reproductions of the photo mask disclosed in FIGS. 5-12 inclusive.

Figure 13:
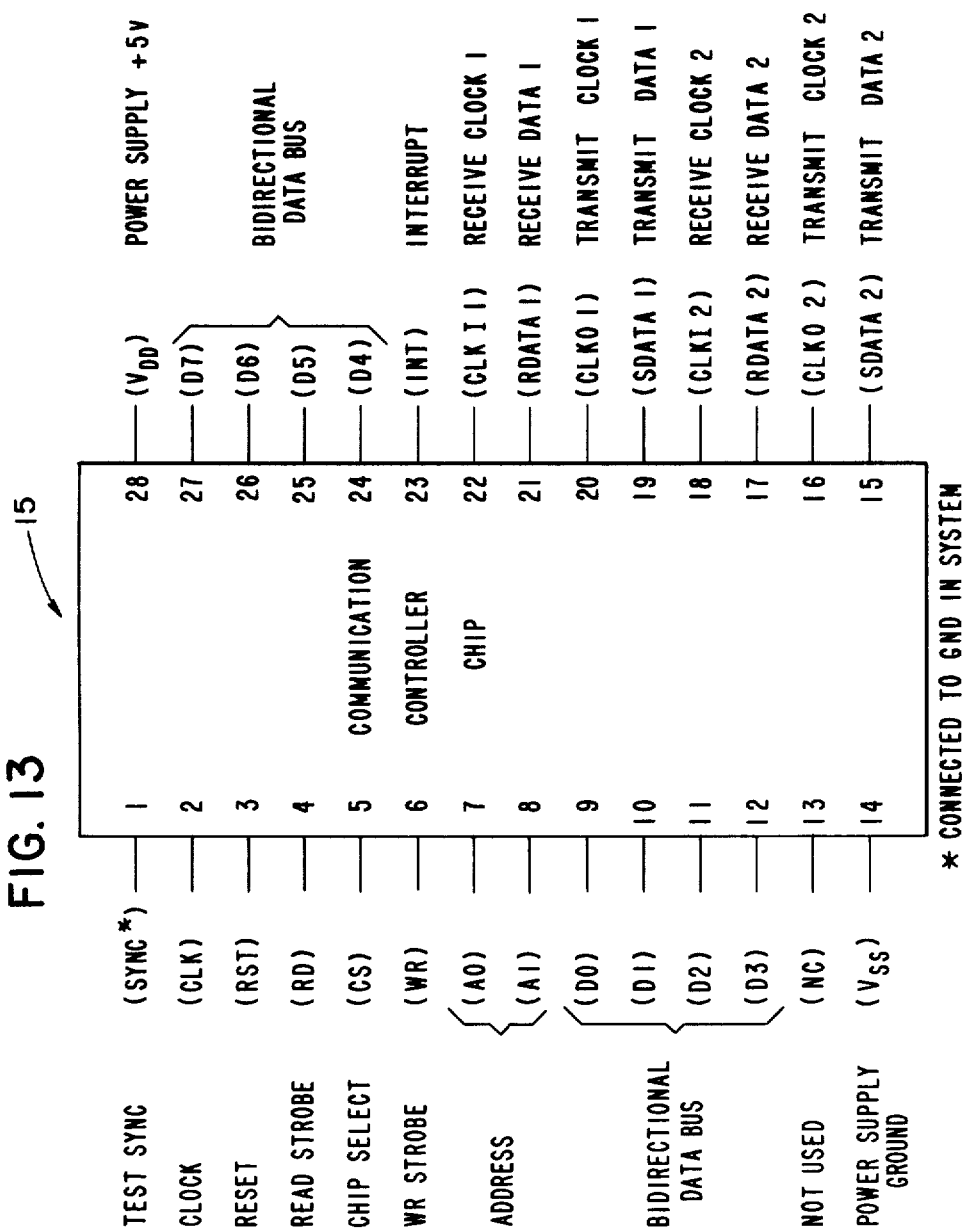
FIG. 13 is a diagram illustrating the package and lead configuration of the package in which the integrated circuit of the present invention is ultimately housed.

In a 28-pin dual-in-line semiconductor package suitable for housing the communication controller interface chip 15 described herein is illustrated in FIG. 13. The sequence of the pins is close to provide maximum utility in placing such a chip on a printed circuit board.

While the invention has been described with respect to a particular detailed layout of the communication controller chip, certain variations can be made by those skilled in the art without departing from the true spirit and scope of the invention as defined in the appended claims.

We claim:

1. An integrated circuit chip for use in a data processing system which includes a processor and a plurality of remote devices in which the processor generates a plurality of first and second control signals for use in transmitting data bits to a remote device, said circuit chip comprising in combination:

a plurality of input and output transmission channels connected to said remote devices over which data bits are transmitted between the processor and the remote device;

first storage means connected to the processor for storing data bits received from the processor;

second storage means for storing the first and second control signals received from the processor for generating third control signals selecting a first or second clock frequency, a fourth control signal selecting the number of data bits to be transmitted and a timing control signal;

means connected to said second storage means for generating a plurality of clock signals at a first or second timing frequency in accordance with the third control signals received from said second storage means;

control means for transmitting the data bits stored in said first storage means and the generated clock signals over said output transmission channels to the remote devices;

said integrated circuit chip having first, second, third and fourth sequentially located edges;

said transmission channels being located adjacent said third edge;

said first storage means being located substantially closer to said third edge than to said first edge;

said signal generating means being located substantially closer to said first edge than to said third edge;

said second storage means being located substantially closer to said second edge than to said fourth edge; and said control means being located substantially closer to said first edge than to said third edge.

2. The integrated circuit chip of claim 1 in which each of said channels comprises a plurality of transmission lines, said integrated circuit chip including means coupled to said clock signals generating means and two of said transmission lines for transmitting said generated clock signals to said remote devices and a plurality of bonding pads located adjacent said third edge for receiving the data bits to be transmitted between the processor and the remote devices, said transmitting means connected to said bonding pads by which data bits stored in said first storage means are transmitted over said transmission lines to the remote devices.

3. The integrated circuit chip of claim 2 wherein said clock signals generating means includes first counter means outputting a plurality of clock signals and a frequency selecting means connected to said first counter means for outputting said clock signals at a first or second timing frequency in response to receiving said third control signals.

4. The integrated circuit chip of claim 3 wherein said control means includes means connected to said frequency selecting means for outputting the clock signals outputted by said frequency selecting means when operated, said control means further includes a control circuit connected to said first storage means and enabled by said timing control signal for operating said clock signals outputting means to output the clock signals at one of said timing frequencies to said remote devices enabling the data bits stored in said first storage means to be transmitted to the remote devices, said clock signals outputting means and said control circuit being located substantially closer to said first edge than to said third edge.

5. The integrated circuit chip of claim 4 in which said control means further includes a second counter means connected to said clock signals outputting means for counting the number of clock signals outputted by said frequency selecting means and a first decoder means connected to said second storage means and said second counter means for limiting the number of clock signals outputted by said clock signal outputting means means in response to receiving said fourth control signal, said second counter means and said first decoder means being located substantially closer to said first edge than to said third edge.

6. The integrated circuit chip of claim 5 which further includes second decoder means connected to the processor for outputting the address of the remote device for which the data bits stored in said first storage means is directed in response to receiving said first control signals, said second decoder means being located adjacent the corner between said third and fourth edges.

7. The integrated circuit chip of claim 6 which further includes a third storage means connected to said first storage means for storing the data bits stored in said first storage means, said control circuit enabled by the timing control signal to load the data bits stored in said first storage means into said third storage means for transmission over the transmission lines to the remote device, said first decoder means further connected to said clock signals outputting means for generating a fifth control signal disabling the transmission of said data bits from said third storage means after a predetermined number of data bits have been transmitted to the remote device, said third storage means being located substantially closer to said third edge than to said first edge.

8. An integrated circuit chip for use in a data processing system which includes a processor and a plurality of remote devices in which the processor will output a plurality of first and second control signals enabling data signals to be transmitted between the processor and the remote devices, said circuit chip comprising in combination:

a plurality of input and output transmission wires connected to said remote devices over which data signals are transmitted;

first control means receiving data signals from the processor for transmitting the data signals over said output transmission wires to a remote device;

second control means receiving data signals from a remote device over said input transmission wires for transmitting the received data signals to the processor;

first register means connected to the processor for storing said first and second control signals for generating a plurality of third control signals selecting a first or second clock frequency, a fourth control signal selecting the number of data signals transmitted between the processor and the remote devices and a timing control signal in response to the storing of said first and second control signals;

means connected to said first register means for generating a plurality of clock signals at a first or second timing frequency in accordance with the third control signals received from said first register means;

first bus means connected to said first register means over which said first, second, third, and fourth control signals and said timing control signal are transmitted;

said first control means includes first logic circuit means for transmitting data signals from said processor and the selected clock signals to one of said remote devices;

said second control means includes second logic circuit means for transmitting the generated clock signals to the remote device enabling the data signals to be transmitted from the remote device to the processor;

said integrated circuit chip having first, second, third and fourth sequentially located edges;

said first and second control means being located substantially closer to said third edge than to said first edge;

said first and second logic circuit means being located substantially closer to said first edge than to said third edge;

said bus means being located substantially in the middle of the chip and extending in a direction parallel to said first and third edges; and said signals generating means being located substantially closer to said first edge than to said third edge.

9. The integrated circuit chip of claim 8 wherein said first and second control means includes a plurality of bonding pads connected to said transmission wires for receiving said data signals, said bonding pads being located adjacent said third edge.

10. The integrated circuit chip of claim 9 wherein said clock signals generating means includes a first counter means connected to said first register means for outputting a plurality of clock signals and a frequency selecting circuit connected to said counter means for outputting the clock signals at a first or second timing frequency in accordance with the third control signals received from said first register means.

11. The integrated circuit chip of claim 10 wherein said first logic circuit means includes a second clock signals generating means connected to said frequency selecting circuit for outputting the clock signals outputted by said frequency selecting circuit when operated, said integrated circuit chip further includes a second bus means connected to said frequency selecting means and said second clock signal generating means over which said clock signals are transmitted, said first logic circuit means further includes a control circuit connected to said first register means and enabled by said first control signals for operating said second clock signals generating means to output the clock signals at one of said timing frequencies to said remote devices enabling the data signals received from the processor to be transmitted to the remote devices, said second clock signals generating means and said control circuit being located substantially closer to said first edge than to said third edge and said second bus means being located adjacent said third edge.

12. The integrated circuit chip of claim 11 in which said first register means generates said fourth control signal in response to receiving said first control signals, said first logic circuit means further includes second counter means connected to said second clock signals generating means for counting the number of clock signals outputted by said second clock signals generating means and a counter decoder means connected to said first storage means and said second counter means for limiting the number of timing signals outputted by said second clock signal generating means in accordance with the second control signals stored in said first storage means, said second counter means and said counter decoder means being located substantially closer to said first edge than to said third edge.

13. The integrated circuit chip of claim 12 which further includes an address decoder connected to said processor for outputting the address of the remote device for which the data signals received by said first transmitting means are directed in response to receiving said second control signals and a third bus means connected to said address decoder over which said second control signals are transmitted, said address decoder located adjacent the corner between said third and fourth edges and said third bus means being located adjacent the second, third and fourth edges.

14. The integrated circuit chip of claim 13 in which said first control means includes a output buffer means for storing the data signals to be transmitted to the remote device and received from the processor and a second register means connected to said output buffer means for storing the data signals stored in said output buffer means into said second register means for transmitting the data signals to the remote devices, said first logic control means further including second decoder means connected to said second clock signals generating means for generating a fifth control signal disabling the transmission of said data signals from said second register means after a predetermined number of data signals have been transmitted to the remote device, said second register means being located substantially closer to said third edge than to said first edge.

* * * * *